(12) United States Patent
Arghavani et al.

(10) Patent No.: US 6,620,713 B2
(45) Date of Patent: Sep. 16, 2003

(54) INTERFACIAL LAYER FOR GATE ELECTRODE AND HIGH-K DIELECTRIC LAYER AND METHODS OF FABRICATION

(75) Inventors: Reza Arghavani, Aloha, OR (US); Robert Chau, Beaverton, OR (US); Mark Doczy, Beaverton, OR (US); Brian Roberds, Escondido, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/038,410

(22) Filed: Jan. 2, 2002

(65) Prior Publication Data

US 2003/0124871 A1 Jul. 3, 2003

(51) Int. Cl.⁷ .................................... H01L 21/3205
(52) U.S. Cl. ........................................ 438/585
(58) Field of Search ............................. 438/200, 287, 438/488, 585, 197

(56) References Cited

U.S. PATENT DOCUMENTS

| 4,084,024 A | * | 4/1978 | Schumacher | ................ | 427/215 |
| 4,481,229 A | * | 11/1984 | Suzuki et al. | ................ | 427/38 |
| 4,987,102 A | | 1/1991 | Nguyen et al. | | |
| 5,750,211 A | | 5/1998 | Weise et al. | | |
| 6,432,763 B1 | * | 8/2002 | Yu | ............................. | 438/217 |
| 6,451,641 B1 | * | 9/2002 | Halliyal et al. | ............. | 438/200 |

\* cited by examiner

*Primary Examiner*—David Nelms
*Assistant Examiner*—Quoc Hoang
(74) *Attorney, Agent, or Firm*—Blakely, Sokoloff, Taylor & Zafman LLP

(57) ABSTRACT

Method of fabricating a semiconductor device. The semiconductor device comprises a substrate, a high-k gate dielectric layer formed on the substrate, and a hydrogen-free gate electrode deposited on the high-k gate dielectric layer wherein the hydrogen-free gate electrode is conductive. The method comprises depositing the high-k gate dielectric layer on the substrate, sputtering the gate electrode on the gate dielectric layer and treating the gate electrode such that the gate electrode is conductive.

6 Claims, 6 Drawing Sheets

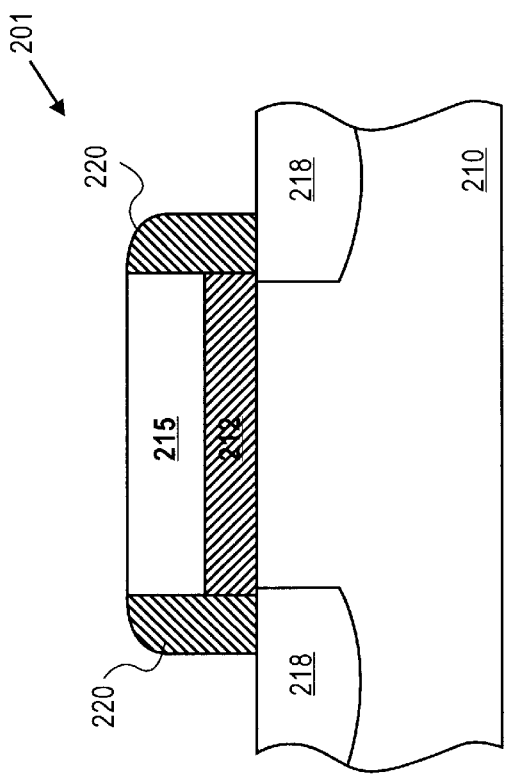
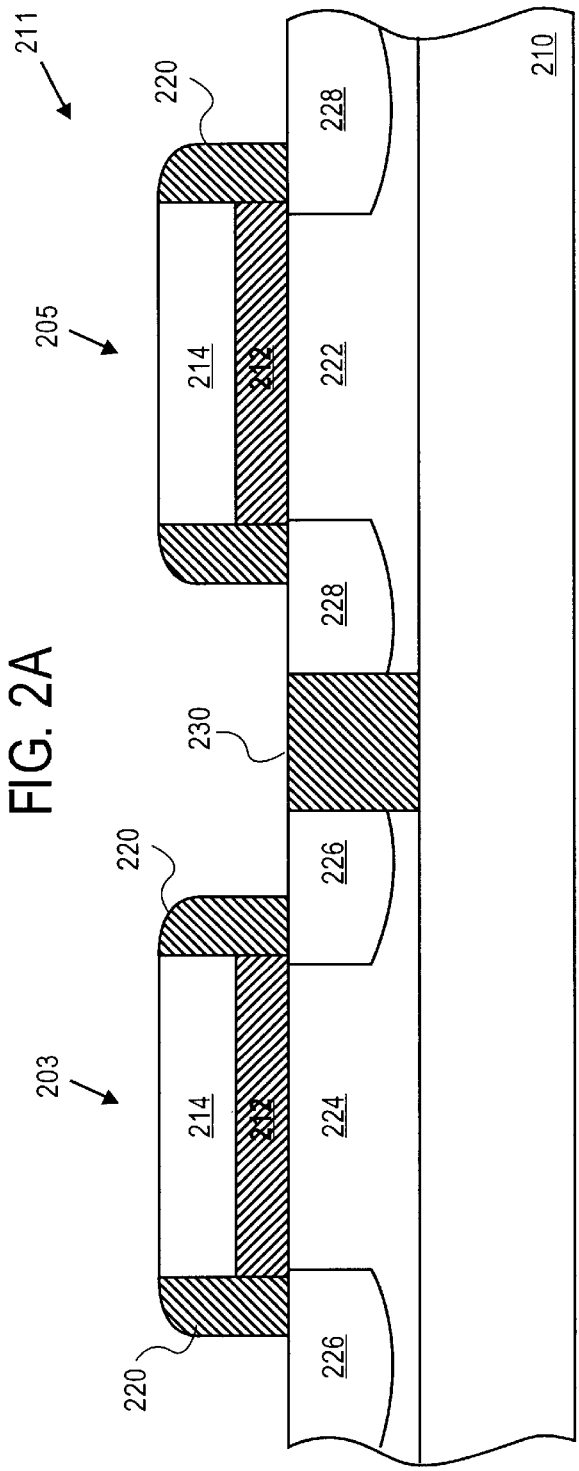

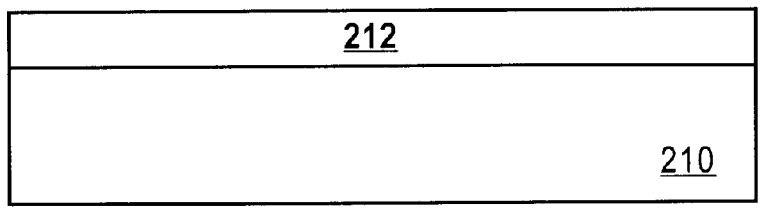
FIG. 4A
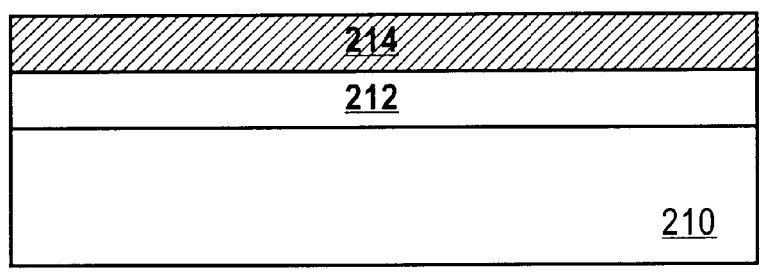
FIG. 4B
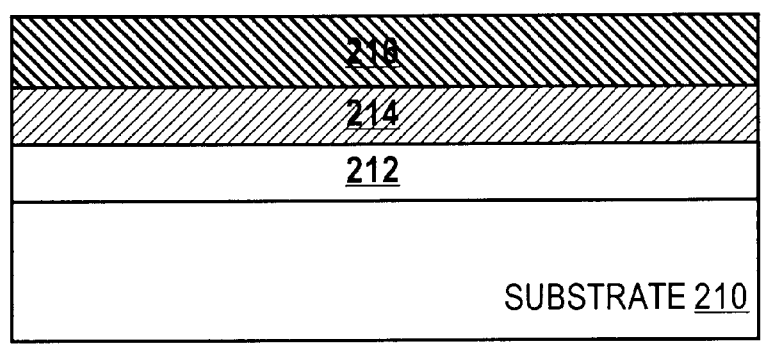
FIG. 4C
FIG. 4D

INTERFACIAL LAYER FOR GATE ELECTRODE AND HIGH-K DIELECTRIC LAYER AND METHODS OF FABRICATION

BACKGROUND OF THE INVENTION

1. Field of the Invention

The present invention directs to a semiconductor device and methods of fabricating the same. Specifically, the present invention directs to methods and apparatuses of fabricating a metal-oxide-semiconductor (MOS) transistor comprising a hydrogen-free silicon interfacial layer between a high-k gate dielectric layer and a silicon gate electrode and a MOS transistor comprising a hydrogen-free gate electrode.

2. Discussion of Related Art

Electronic circuits are often manufactured as integrated circuits in and on semiconductor wafers. An integrated circuit includes many interconnected electronic components, such as transistors, diodes, capacitors and other devices, which are manufactured in and on the semiconductor wafer. FIG. 1A illustrates a conventional metal-oxide-semiconductor (MOS) transistor 100, which are manufactured on a semiconductor substrate 112. Transistor 100 includes a gate oxide layer 104 and a gate electrode 106, typically made of polysilicon, on the gate oxide layer 104. Spacers 108 are usually formed on opposing sides of the gate electrode 106. The substrate 102 is generally P or N doped silicon depending on whether a p-type of n-type transistor is to be formed on the substrate 102. The substrate includes source and drain regions 110 which are of opposite doping to the rest of the substrate 102. The source and drain regions 110 are usually manufactured by ion implantation of dopants respectively after the gate electrode and after the spacers 108 are formed.

Silicon dioxide, silicon oxynitride, and nitrided oxides films are typical examples of materials used for the gate oxide layer 104. This layer prevents current from flowing between the gate electrode 106 and the source/drain regions 110 or channel region 105 in electronic devices (e.g., the MOS transistor 100). This is typically used in a MOS field-effect transistor (MOSFET).

Current demands for thinner and smaller products require increase density of devices on a semiconductor chip that are faster and consuming less power. There are thus demands for scaling down the devices in all dimension, lateral and vertical, to achieve adequate device performance. The vertical scaling down involves making all of the layers in the electronic devices as thin as possible. Alternatively, it also is established that to drive current into the MOS transistor, the gate oxide is made as thin as possible. Silicon oxide has been the preferred gate dielectric material, however, silicon oxide cannot be made so thin that it would compromise the performance and functionality of the electronic devices (e.g., lost of function due to charge leakage). The limitation for the thickness of the silicon oxide is the oxide breakdown and the reliability of the process and the technology being used to form a uniform and thin silicon oxide. It has been one practice to substitute the silicon dioxide layer with a higher permittivity gate dielectric since a high permittivity layer 114 can be made thinner and still maintain a high dielectric characteristic. (See FIG. 1B). The materials used to form the high permittivity gate dielectric 114 are referred to as high-k dielectric materials (high dielectric constants).

Most high-k gate dielectric materials however, are not compatible with crystalline silicon or polycrystalline silicon (polysilicon) gate electrodes. In order to switch to the high-k gate dielectric 114, many manufacturers have replaced the conventional polysilicon gate electrode 106 with a metal gate electrode 116 (see FIG. 1B). One problem with metal gate electrode 116 is a complex fabrication process is required to make the device due to the workfunction requirement.

It is well known that many different electronic devices are often manufactured on the same substrate 102. One example of an integration of many electronic devices on the same wafer substrate is a complimentary metal oxide semiconductor (CMOS) device, in which an n-type MOS (NMOS) and a p-type MOS (PMOS) are made on the same silicon wafer substrate. It is known that the threshold voltage of a CMOS device is a critical parameter for the proper functioning of the electronic devices. Proper workfunctions are among the necessary factors to ensure that the threshold voltage is achieved. The metal gate electrode 116 for the CMOS device thus, will need to have workfunctions that match both the PMOS and the NMOS devices. One metal is typically insufficient to satisfy that requirement. Thus, with the metal gate electrode 116, additional processing steps are required to obtain the correct threshold voltage.

For example, a metal film 1 is used to make the gate electrode having a correct workfunction for the NMOS 120 and a metal film 2 is used to make the gate electrode having a correct workfunction for the PMOS 122. (See FIG. 1C). Use of a dual film deposition severely complicates integration. With the metal gate electrode, it is thus, complicated and difficult to make both the NMOS and the PMOS on the same substrate.

There is thus a need to have an electronic device having the high-k gate dielectric layer that is compatible with the silicon or polysilicon gate electrode.

BRIEF DESCRIPTION OF THE DRAWINGS

The present invention is illustrated by way of example and not limitation in the figures of the accompanying drawings, in which like references indicate similar elements and in which:

FIGS. 2A and 2B illustrate an exemplary electronic device of the present invention which includes a hydrogen-free silicon gate electrode deposited on a high-k dielectric layer;

FIGS. 4A to 4G illustrate an exemplary method of forming a MOS having a hydrogen-free interfacial silicon layer between the high-k dielectric layer and the gate electrode.

DETAILED DESCRIPTION OF THE PRESENT INVENTION

Figure 1A:
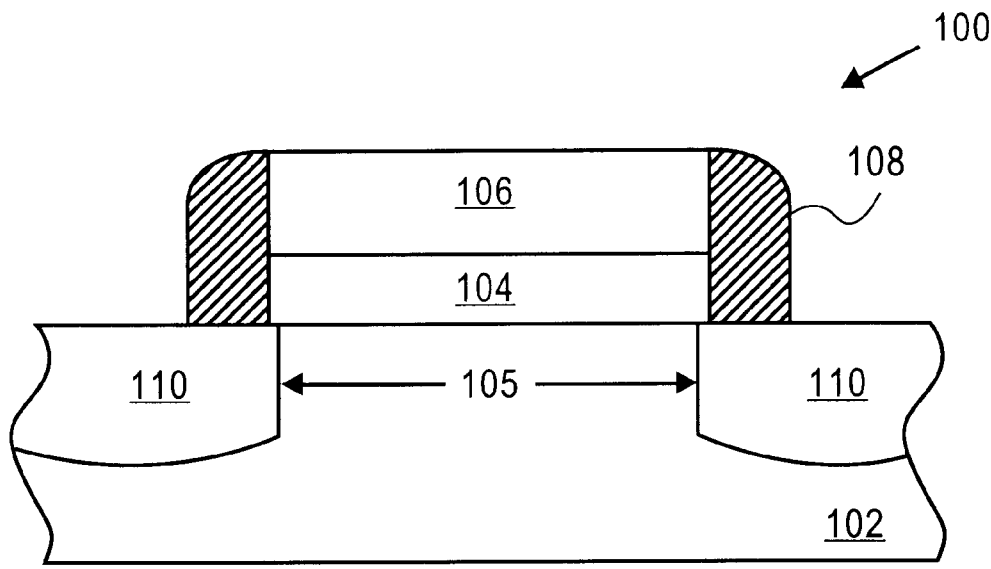
FIGS. 1A to 1C illustrate exemplary electrical devices of the prior art.
Figure 1B:
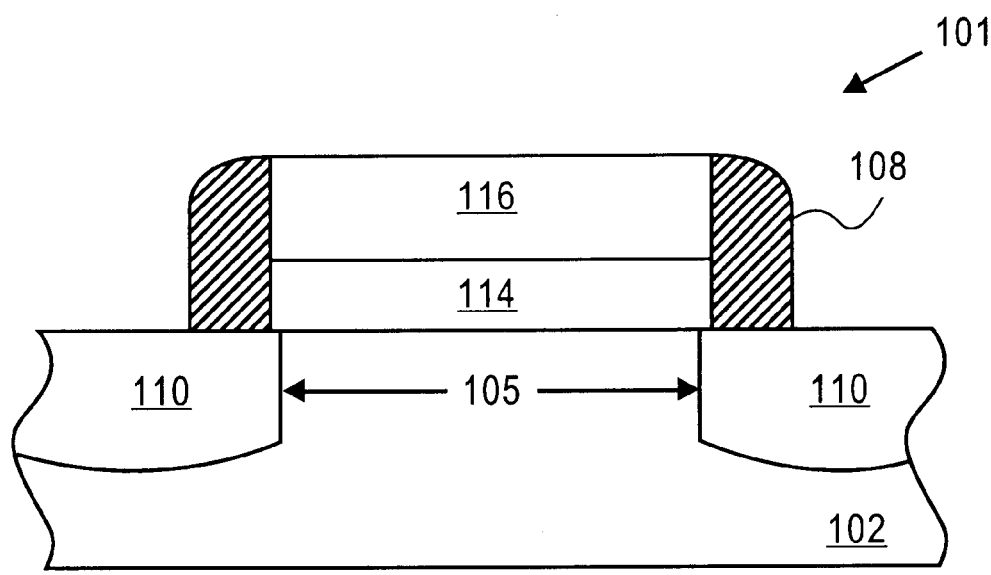
Figure 1C:
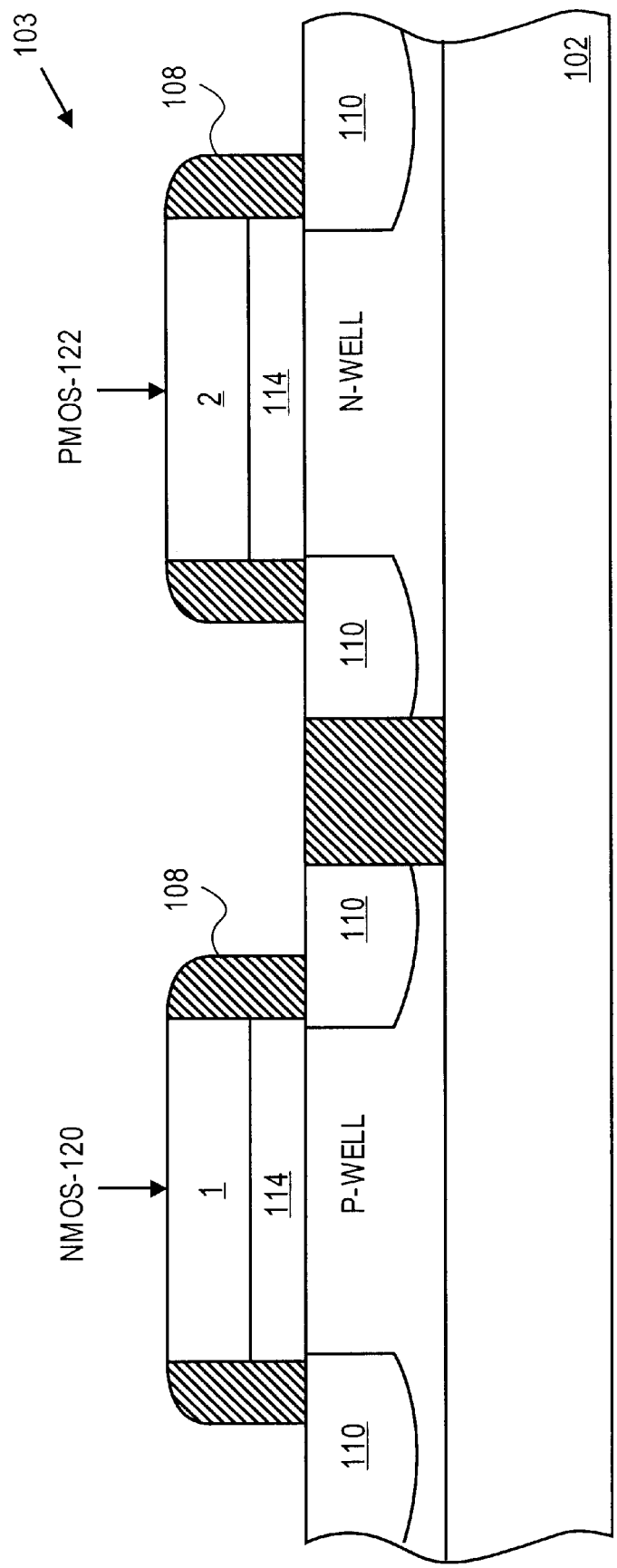

The present invention directs to an electronic device having a gate electrode layer that does not interact with the high-k dielectric layer and methods of forming the electronic device. The gate electrode layer may couple to an interfacial layer that prevents the interaction between the gate electrode layer and the high-k dielectric layer. The gate electrode layer may also be fabricated such that it does not interact to damage the high-k dielectric layer or that its deposition process does not include impurities that damage the high-k dielectric layer.

In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

Future generation of semiconductor device demands for thin layer of gate dielectric in order to help make the device thinner and smaller and to enable integration of many more electronic devices on a single substrate. Thin gate dielectric layer made out of silicon oxide does not have sufficient permittivity (or high enough dielectric constant) thus causing charge leakage or gate leakage via direct tunneling thus leading to unreliable and or defective devices. Switching to a high-dielectric layer to replace the silicon oxide has caused a compatibility problem (e.g., polysilicon interaction with the high-k dielectric layer). Currently, one way to solve the problem is to replace the silicon or polysilicon gate electrode with metal gate electrode. Using the metal gate electrodes prevents the destruction to the high-k dielectric layer but it multiplies the complexity of implementing the high-k dielectric layer into processing an electronic device such as the CMOS device. For the CMOS device, this is due to the noncomplimentary nature as both the NMOS and the PMOS work function cannot be matched with the same metal.

As mentioned above, most polysilicon layers are not compatible with the high-k dielectric layer. We have discovered that hydrogen is one of the factors that trigger the interaction between the polysilicon and the high-k dielectric layer to destroy the high-k dielectric layer. One method to prevent the interaction between the polysilicon gate electrode layer and the high-k dielectric layer is to deposit a hydrogen-free interfacial layer between the polysilicon and the high-k dielectric layer. Another method is to deposit the silicon (or polysilicon) gate electrode layer using a method that introduces no hydrogen to the high-k dielectric layer during the deposition of the silicon (or polysilicon) gate electrode.

FIG. 2A illustrates an exemplary embodiment of a MOS transistor 201 made in accordance to the present invention. The MOS transistor 201 comprises a semiconductor substrate 210, a high-k dielectric layer 212 which is formed on the semiconductor substrate 210, and a gate electrode 215 which is formed on the high-k dielectric layer 212.

The semiconductor substrate 210 includes a monocrystalline semiconductor wafer, a semiconductor-on-insulator wafer, or any other substrate used to form semiconductor devices. In one example, the semiconductor substrate 201 may be made of silicon and may have a dopant concentration which is preferably at least $1 \times 10^{14}$ atoms per cubic centimeter and more preferably at least $3 \times 10^{16}$ atoms per cubic centimeter. The dopants include either a p-type materials (e.g., boron) or n-type material (e.g., arsenic) to create either a PMOS or an NMOS transistor. In another example, the substrate 210 is doped such that it comprises both a p-type conductivity region 222 and an n-type conductivity region 224 (see FIG. 2B) in instances where a CMOS device is to be formed. In this example, the NMOS device is formed on the p-type region of the substrate and the PMOS device is formed on the n-type region of the substrate. In yet another example, the substrate 210 may include source and drain regions 218 respective for the type of transistors to be formed on the substrate.

The high-k dielectric layer 212 may be formed from a number of different materials as provided below, wherein the dielectric constant (e.g., permittivity) of the high-k dielectric layer 212 varies depending on the type of material used. The high-k dielectric layer 212 can be deposited on the substrate 201 through various conventional methods such as chemical vapor deposition or physical vapor deposition. The dielectric constant of the high-k dielectric layer 212 is typically greater than that of silicon dioxide, a material normally used to form a conventional gate dielectric. The silicon dioxide has a dielectric constant of about 4.2. The high-k dielectric layer 212 of the present invention has a higher dielectric constant greater than that of rat the silicon dioxide gate dielectric. The dielectric constant for the high-k dielectric layer 212 in the present embodiment ranges from 10–200. In one preferred embodiment, the high-k dielectric layer 212 has a dielectric constant of 20.

Examples of materials having high dielectric constant include lanthanum oxide, zirconium oxide, hafnium oxide, and titanium oxide, to name a few. Materials having higher dielectric constants may also be used. Examples of such materials include barium strontium titanate (BST) which has a dielectric constant approximately ranging from 20 to 200, tantalum oxide which has a dielectric constant approximately ranging from 20 to 200, lead zinc nitrate (PZN) which has a dielectric constant of about 7,333 and lead scandium tantalum oxide (PST) which has a dielectric constant of about 3,000. It will be appreciated that the dielectric constant values given above are approximate only and can vary with the process techniques used to form and measure the permittivity of the materials.

The thickness of the high-k dielectric layer 212 depends on considerations such as characteristics of the insulation layers and reliability of the electronic device. Exemplary thickness ranges from 10 to 300 angstroms. It is established that as compared to silicon dioxide, the thickness of the high-k dielectric layer 212 can be lower than the thickness for the conventional silicon dioxide gate dielectric layer having comparable dielectric constants. A thin high-k dielectric layer will have a greater capacitance than an equivalently thin silicon dioxide dielectric layer. Alternatively, the thickness of the high-k dielectric can be made physically thicker than SiO2 in order to achieve the same capacitance. Since thicker dielectric films exhibit less leakage, use of high-k films can achieve high capacitance with far less charge leakage than SiO2.

Continuing with FIG. 2A, the gate electrode 215 is deposited on the high-k dielectric layer using physical vapor deposition method (see below). The gate electrode 215 comprises a hydrogen-free silicon layer having a thickness of approximately 1000 to 2000 angstroms depending on application. In one example, hydrogen-free hydrogen refers to a silicon layer that is substantially free of silicon (e.g., hydrogen contaminants in the order of parts per million). The silicon source that is used to form the hydrogen-free silicon layer may include some minimal traces of impurities of less than 1 part per million including hydrogen (e.g., electronic grade silicon crystal). Minimal traces of hydrogen impurities in the silicon source will still give a silicon layer that is substantially or free of hydrogen impurities. In another example, the hydrogen-free silicon refers to a silicon layer that includes only deposited silicon particles (e.g., silicon deposited by sputtering). In yet another example, the hydrogen-free silicon refers to a silicon layer that has been formed from using an ultra pure silicon or electronic grade silicon source containing no hydrogen impurities such that no hydrogen contaminants are present during deposition.

One such silicon source includes a pure silicon crystal such as one grown using Czochralski crystal growth technique practiced by companies such as Tosoh Inc., Ohio or MRC Material Research Corp., California. The Czochralski crystal growth involves multiple steps of purifying the silicon crystals to get pure silicon solids. In yet another example, the hydrogen-free silicon refers to a silicon layer that has been formed from using a silicon precursor that introduces no hydrogen into the deposition chamber such that the hydrogen contaminants interact with the high-k dielectric layer 212. Examples of hydrogen free precursors are $SiCl_4$, $SiF_4$, $SiFCl_3$, $SiF_3Cl$, or $SiBr_4$.

The gate electrode 215 is also doped so that it is conductive and so that it has a workfunction matching with the type of the transistor to be formed. The dopants can be boron or arsenic/phosphorous depending on the type of the transistor, for example, boron for a PMOS transistor and arsenic/phosphorous for an NMOS transistor.

FIG. 2A also illustrates that the MOS transistor 201 also includes source and drain regions 218 which are either formed by dopants for p-type or n-type depending on whether the MOS transistor 201 is a PMOS or an NMOS. Conventional methods such as ion implantation can be used to form these source and drain regions 218. Moreover, this figure also illustrates that the MOS transistor 201 includes spacers 220 which are formed according to conventional methods (e.g., chemical vapor deposition) using insulating materials such as silicon dioxide oxide, nitride, or oxy-nitride, or other suitable materials known in the art.

FIG. 2B illustrates an exemplary embodiment of a CMOS device 211 made in accordance to the present invention. The CMOS device 211 comprises a PMOS 203 and an NMOS 205. Both of the PMOS 203 and the NMOS 205 are fabricated on a semiconductor substrate 210 which is further coated with a high-k dielectric layer 212. Each of the PMOS 203 and the NMOS 205 further includes a gate electrode 215, which is formed on the high-k dielectric layer 212.

The CMOS device 211 comprised of components similar to the MOS transistor 201 described in FIG. 2A in all aspects. The CMOS device 211 however further includes an n-region 224 for the PMOS 203 and p-region 222 for the NMOS 205. The source and drain regions in each of the PMOS 203 and the NMOS 205 are doped regions in the substrate 210 with dopants for the particular type of transistors (e.g., regions 228 are doped with n-type dopants for NMOS 205 and regions 226 are doped with p-type dopants for PMOS 203). The CMOS device 211 also includes an isolation region 230 such shallow trench (STI) regions to isolate the individual transistors formed in the substrate 201.

Figure 3:
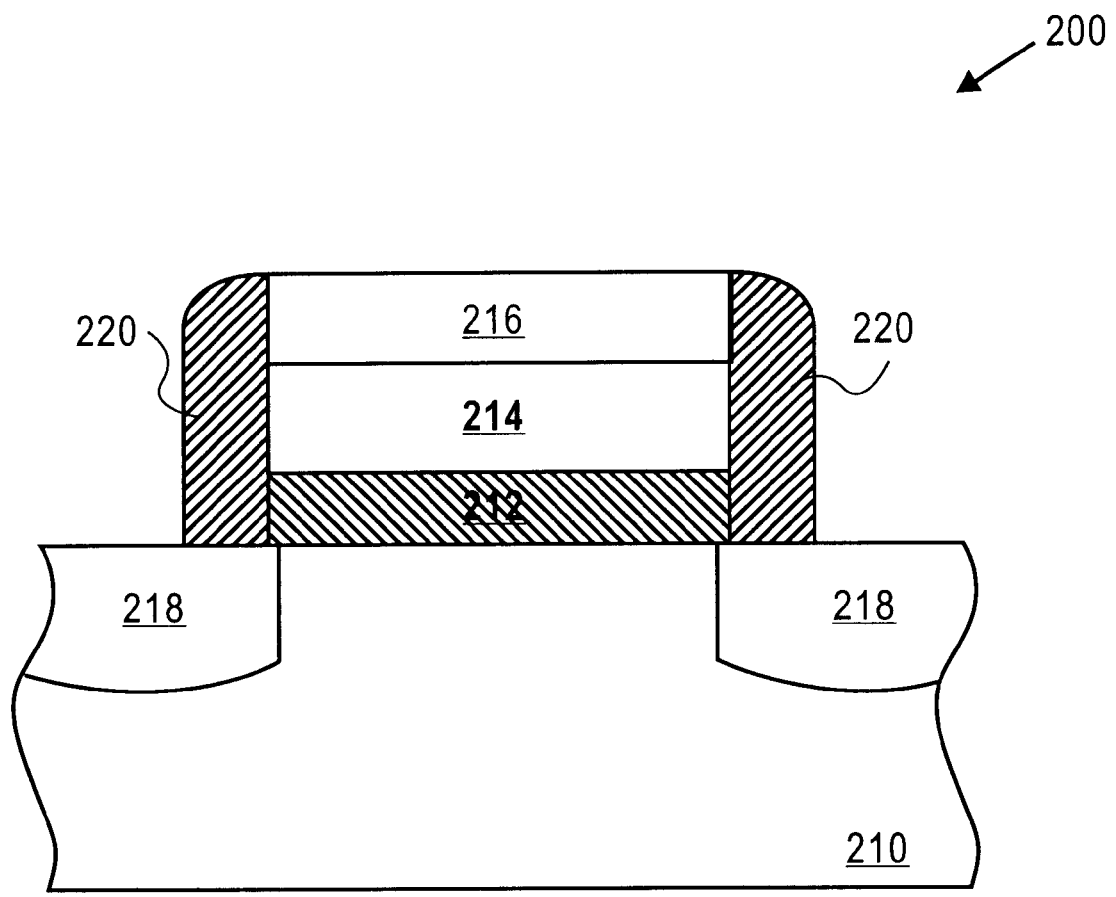
FIG. 3 illustrates an exemplary electronic device of the present invention which includes a high-k dielectric layer and the silicon gate electrode having a hydrogen-free interfacial silicon layer deposited between them.

FIG. 3 illustrates another exemplary embodiment a MOS transistor 200 made in accordance to the present invention. The MOS transistor 200 comprises a semiconductor substrate 210, a high-k dielectric layer 212 which is formed on the semiconductor substrate 210, an silicon interfacial layer 214 which is formed on the high-k dielectric layer 212, and a polysilicon gate electrode 216 which is formed on the silicon interfacial layer 214. The MOS transistor 200 also includes source and drain regions 218 which are either formed by dopants for p-type or n-type depending on whether the MOS transistor 201 is a PMOS or an NMOS transistor. Furthermore, the MOS transistor 201 includes spacers 220 which are formed according to conventional methods using insulating materials such as silicon dioxide oxide, nitride, or oxy-nitride, or other suitable materials known in the art.

The semiconductor substrate 210 in FIG. 3 is similar to the one discussed in FIG. 2A which includes a monocrystalline semiconductor wafer, a semiconductor-on-insulator wafer, or any other substrate used to form semiconductor devices. In a preferred embodiment, the semiconductor substrate 201 may be doped with a dopant having a concentration of about $3 \times 10^{16}$ atoms per cubic centimeter. The dopants include either a p-type materials (e.g., boron) or n-type material (e.g., arsenic) depending on whether a PMOS or an NMOS is to be formed on the substrate 201. The substrate 201 may also be doped with dopants to form source and drain regions 218.

Similar to above, the high-k dielectric layer 212 may be formed from a number of different materials having a high dielectric constant such as lanthanum oxide, zirconium oxide, hafnium oxide, and titanium oxide, to name a few. The preferred dielectric constant for the present embodiment is about 20. Other materials having a much higher dielectric constant as barium strontium titanate (BST), tantalum oxide, lead zinc nitrate (PZN), and lead scandium tantalum oxide (PST) can also be used. The thickness of the high-k dielectric layer 212 depends on considerations such as characteristics of the insulation layers and reliability of the electronic device. Exemplary thickness ranges from 10 to 300 angstroms. The preferred thickness ranges from 10 angstroms to 200 angstroms.

In one embodiment, the silicon interfacial layer 214 is a silicon layer deposited upon the high-k dielectric layer 212 using a physical vapor deposition process (see below). In one example, the silicon interfacial layer 214 is a sputtered silicon layer. The silicon interfacial layer 214 of the present embodiment is hydrogen-free. The silicon interfacial layer 214 comprises of silicon and/or silicon comprising elements such as silicon germanium. The thickness of this interfacial silicon layer ranges from 25 to 2000 angstroms. The preferred thickness is such that the silicon interfacial layer 214 is sufficient to prevent hydrogen interaction that may occur between the high-k dielectric layer 212 and the polysilicon gate electrode 216 during the deposition of the polysilicon gate electrode 216 on the silicon interfacial layer 214. The preferred thickness of the silicon interfacial layer 214 is also such that it is sufficient to protect the high-k dielectric layer 212 from interacting with the hydrogen components that may exist during the deposition of the polysilicon gate electrode 216. In one example, such preferred thickness is approximately 200 angstroms.

The polysilicon gate electrode 216 is deposited on the silicon interfacial layer 214 using physical vapor deposition or chemical vapor deposition methods (see below). The polysilicon gate electrode 216 may or may not include hydrogen impurities. The present of the silicon interfacial layer 214 prevents the interaction between the polysilicon gate electrode 216 and the high-k dielectric layer 212. In this example, the polysilicon gate electrode 216 can be deposited on the silicon interfacial layer 214 using any conventional manner that may or may not introduce hydrogen impurities to the high-k dielectric layer 212. The polysilicon gate electrode 216 thus, needs not be hydrogen-free in its composition or during its deposition process.

The polysilicon gate electrode 216 is also doped so that it is conductive and so that it has a workfunction matching with the type of the transistor to be formed. The dopants can be boron or arsenic depending on the type of the transistor, for example, boron for a PMOS transistor and arsenic for an NMOS transistor.

In another embodiment, the polysilicon gate electrode 216 of the MOS transistor 200 is replaced with a monocrystalline silicon gate electrode 216. The monocrystalline silicon gate electrode 216 is also deposited on the silicon interfacial layer 214 using physical vapor deposition or chemical vapor deposition methods (see below). The monocrystalline silicon gate electrode 216 may or may not include hydrogen impurities. The present of the silicon interfacial layer 214 prevents the interaction between the monocrystalline silicon gate electrode 216 and the high-k dielectric layer 212. In this example, the monocrystalline silicon gate electrode 216 can be deposited on the silicon interfacial layer 214 using any conventional manner that may or may not introduce hydrogen impurities to the high-k dielectric layer 212. The monocrystalline silicon gate electrode 216 thus, needs not be hydrogen-free in its composition or during its deposition process.

Figure 4D:
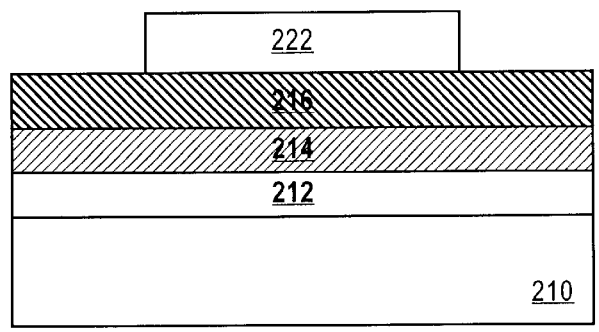

The following sections discuss exemplary methods for fabricating the transistors described in the figures above. FIGS. 4A–G illustrates an exemplary process of fabricating a MOS transistor according to the present invention. As illustrated in FIG. 4A, a semiconductor device substrate 210 is first provided. In the application where several electronic devices are formed on the same substrate as in the case of a CMOS device, isolation regions such as shallow trench (STI) regions to isolate the individual transistor are formed in substrate 210 prior to the formation of the high-k dielectric layer 212 (see FIG. 2B). The STI regions can be created according to conventional methods. In one example, the substrate 210 is doped with dopants for the particular type of the transistor to be formed on the substrate 210 to form source and drain regions 218 (not shown in this figure).

A high-k dielectric layer 212 is then deposited on the substrate 210 using a conventional deposition method. Various conventional deposition methods can be used to form the high-k dielectric layer 212 on the semiconductor substrate 210 which include chemical vapor deposition, low-pressure chemical vapor deposition, atomic layer chemical vapor deposition, and physical vapor deposition (e.g., sputtering), to name a few.

In one exemplary embodiment, the high-k dielectric layer 212 is formed using a sputter deposition process. One exemplary sputtering condition includes sputtering a high-k dielectric material onto the substrate 210 in a sputter chamber. A sputtering target comprising electrically conducting target (e.g., lanthanum, hafnium, or other suitable metal) to form the high-k dielectric layer is used for the sputtering deposition. Oxygen is also supplied into the chamber together with the metal to form the metal oxide for the high-k dielectric layer 212. An ambient gas comprising an inert gas such as argon is used to facilitate the sputtering. Examples of the ambient gas include argon, helium, nitrogen and xenon. The ambient gas flow rate is maintained at approximately 10–100 sccm.

The sputtering may occur at temperature ranging from 20° C. to 250° C. and with a pressure ranging from 1–10 mTorr. Sputtering can be powered by plasma using a voltage of approximately 200 watts. It is preferable to maintain a low temperature condition for the sputtering process. Water can be used to cool off the substrate during deposition. One method to cool the substrate is by allowing water to flow through a self-contained compartment (e.g., tube) placed in proximity with a chuck that holds the wafer substrate in the sputtering chamber to keep the substrate from being heated up during the deposition process.

In a preferred embodiment, the high-k dielectric layer 212 is deposited using chemical vapor deposition (CVD). One exemplary CVD process is atomic layer CVD (ALCVD or ALD) whose process condition includes depositing the high-k dielectric layer 212 at temperature ranging from 200° C. to 700° C. Exact pressures and flows are not critical for atomic layer CVD since the reactions are self limited to a single monolayer deposition. In ALCVD, reactants are supplied in pulses. For a high-k metal oxide deposition, the metal is supplied in one pulse by sublimating a metal chloride (e.g., lanthanum chloride, hafnium chloride, and zirconium chloride) and carrying the sublimated precursor into the deposition chamber with an inert gas flow (e.g., nitrogen). Precisely, one monolayer of metal is deposited on the wafer, continuation of the precursor flow beyond the monolayer formation will result in no further reaction. Once the first monolayer is complete, the second pulse is performed by sublimating $H_2O$ that is also carried into the deposition chamber by an inert gas. The $H_2O$ reacts with the monolayer metal formed on the wafer to form the high-k dielectric metal oxide (e.g., lanthanum oxide, hafnium oxide, and zirconium oxide). Approximately 1Å is deposited per cycle of 2 pulses. The sequence of the two pulses is repeated until the desired film thickness is achieved.

The high-k dielectric layer 212 deposited using chemical vapor deposition typically is less dense and can be annealed at lower temperatures than the high-k dielectric layer 212 using sputter deposition. Also, the CVD process causes less damage to the substrate and yields a better interface between the high-k dielectric layer and the substrate. The preferred method is typically the ALCVD or a CVD process called metalorganic CVD where the metal precursor is organic in nature (e.g., tetrakis-(dimethylamido)titanium, TDMAT).

As set forth in FIG. 4B, following the deposition of the high-k dielectric layer 212, a silicon interfacial layer 214 is deposited. In one preferred embodiment, the silicon interfacial layer 214 is a silicon layer deposited using a sputter deposition process. Other methods can also be used, for example, evaporation. The deposition method should be one that will result in a hydrogen-free or substantially hydrogen-free silicon layer. In one example, the hydrogen-free silicon means that there is no hydrogen contamination in the deposition process such that depositing the silicon interfacial layer 214 introduces no hydrogen to the high-k dielectric layer 212. In another example, the hydrogen-free silicon means that the silicon source reactants used for the formation of the hydrogen-free silicon layer onto the high-k dielectric layer 212 contains no hydrogen impurities. One such silicon source includes a pure silicon crystal such as one grown using Czochralski crystal growth technique. The silicon source may also include some minimal traces of impurities of less than 1 part per million including hydrogen (e.g., electronic grade silicon crystal).

In one exemplary embodiment, the hydrogen-free silicon layer 214 is formed by sputtering silicon on the high-k dielectric layer 212 using a commercially available sputter chamber such as one sold by Applied Materials Inc., Ventura P.V.D. Chamber. Sputtering technique is well known in the art. The sputter chamber used for depositing the silicon layer 214 of the present invention is a commercially available tool called a DC magnetron sputter chamber. In another embodiment, the sputter chamber is in the same unit as the chamber used for depositing the high-k dielectric layer 212. For instance, the high-k dielectric layer 212 is deposited using a sputter deposition process and the silicon interfacial layer 214 is then deposited onto the high-k dielectric layer 212 insitu (in the same chamber). The two deposition steps can be performed in the same sputtering chamber with variation in the deposition parameters suitable for each layer. When the high-k dielectric layer 212 is deposited using other process such as CVD, the same tool may comprise two different chambers, one for the CVD (to deposit the high-k dielectric layer 212) and one for the sputtering (to deposit the hydrogen-free silicon layer 214).

In one example, the silicon interfacial layer 214 has a thickness ranging from 25 to 2000 angstroms on the high-k dielectric layer 212. The silicon interfacial layer 214 formed by sputter deposition occurs in a sputtering chamber that is fed with an ambient gas comprising a noble gas. The exemplary noble gas includes argon, xenon, neon, or krypton. The sputtering chamber also includes a sputtering target comprising silicon, (e.g., silicon and silicon germanium) which is used to obtain the silicon atoms (or particles) for forming the hydrogen-free silicon layer 214. In a preferred embodiment, the sputtering target comprises of single crystal silicon such that a layer of hydrogen-free silicon is formed on the high-k dielectric layer 212. The silicon target of this embodiment may be a target disc having a diameter of about 15 inches and a thickness of approximately 0.25–0.50 inches. One example of the sputtering target in the present embodiment is silicon target formed by Czochralski crystal growth technique mentioned above.

In one exemplary sputtering condition, the silicon target is placed in the sputter chamber. The substrate including the high-k dielectric layer 212 deposited thereon is positioned in close proximity to the silicon target. The substrate temperature is maintained in the range of approximately 20° C. to 500° C. The pressure for the chamber is maintained in the range of approximately 1 mTorr to 10 mTorr. Plasma power of approximately 100 watts to 3000 watts is supplied into the chamber. An ambient gas is flown into the chamber with a rate of approximately 10 sccm to 100 sccm. Increasing the plasma power will speed up the deposition rate. However, high power may heat up the silicon target too high causing destruction or thermal expansion to the silicon target. The plasma power then facilitates the dislodging of the silicon atoms (or particles) which then form a film over the high-k dielectric layer 212.

The preferred conditions for the sputtering process include: substrate temperature less than 200, pressure less than 1 mTorr, plasma power at approximately 100 watts, and ambient gas flow rate of 70 sccm. It is also preferred that the noble gas contains no hydrogen. The growth rate of the silicon layer 214 under these conditions is approximately 25–33 angstroms per minute. It will be appreciated that sputtering can also be done with radio frequency sputtering without departing from the scope of the present invention. In one example, the thickness of the silicon interfacial layer 214 is approximately 200 angstroms. Under the sputter deposition conditions described above, it would take approximately 6 minutes to sputter silicon 214 having a 200 angstrom thickness onto the high-k dielectric layer 212.

In another embodiment, the hydrogen-free silicon interfacial layer 214 is deposited through a process called evaporation. In this embodiment, the pure silicon crystals, which are the silicon source, are heated to their boiling point (e.g., 3200° C.) in a crucible in a low vacuum chamber with pressure maintained at less than 1 mTorr, and preferably, $1 \times 10^{-6}$ Torr (1 $\mu$Torr). The silicon source is converted into silicon vapor. The heating chamber is preferably remote from the deposition chamber where the substrate 210 is positioned. The silicon vapor is then flown into the deposition chamber in the present of a noble carrier gas (e.g., argon). The substrate is maintained at a low temperature (e.g., room temperature). The silicon vapor condenses on the surface of the substrate forming the hydrogen-free silicon layer 214.

Other processes can be used to form the silicon interfacial layer 214 that is hydrogen-free, for example, chemical vapor deposition (CVD), plasma enhanced CVD, or low pressure CVD. A silicon source gas such as a halogenide silicon gas can be used in these CVD processes to form the silicon interfacial layer 214 that is hydrogen-free. Example of a halogenide silicon gas include $SiF_4$, $SiCl_4$, $SiFCl_3$, $SiF_3Cl$, or $SiBr_4$ is used instead of $SiH_4$.

As set forth in FIG. 4C, the next step is to deposit a gate electrode 216. In one example, the gate electrode 216 is a polysilicon layer and in another example, the gate electrode 216 is a monocrystalline silicon layer. The deposition of the gate electrode 216 can be done via chemical vapor deposition (CVD), low-pressure CVD, or plasma enhanced CVD. All of these methods are known in the field.

In one exemplary CVD deposition process, silane mixed with a diluent gas such as nitrogen (N2) is used as the silicon source gas for the deposition of the gate electrode 216. The flow rate of the silicon source gas ranges from 2 sccm to 10 sccm and the flow rate for the diluent gas ranges from 500 sccm to 1000 sccm. The deposition temperature ranges form 500° C. to 750° C., preferably, less than 600° C. And, the deposition pressure is maintained at approximately 10 mTorr. In a preferred embodiment, the hydrogen concentration supplied into the CVD chamber is kept at zero as low as possible (e.g., 1 part in 10) and the deposition temperature should be less than 400° C. to prevent reaction between any hydrogen impurities and the high-k dielectric layer 212. It is however not necessary to deposit the gate electrode 216 in a hydrogen-free environment. The presence of the silicon interfacial layer 214 prevents interaction of the high-k dielectric layer 212 to impurities such as hydrogen.

Alternative silicon source gas such as disilane, dichlorosilane, or halogenated silanes can be used to form the gate electrode 216 according to the methods discussed above. And, other diluent gases such as helium or argon can also be mixed with the silicon source gas for the deposition process.

Figure 4E:
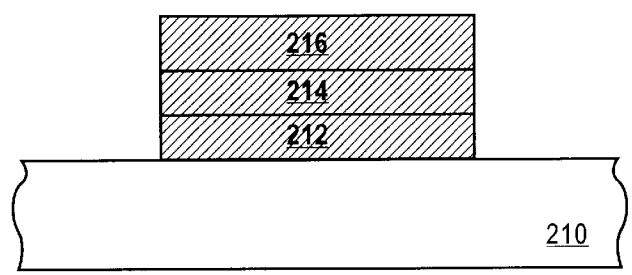

As set forth in FIGS. 4D and 4E, the next step in forming the exemplary MOS transistor is to coat a photoresist layer over the gate electrode 216 and pattern to mask or define the conductivity region. Etching steps are then applied to remove the non-masked area forming the device as shown in FIG. 4E.

Figure 4F:
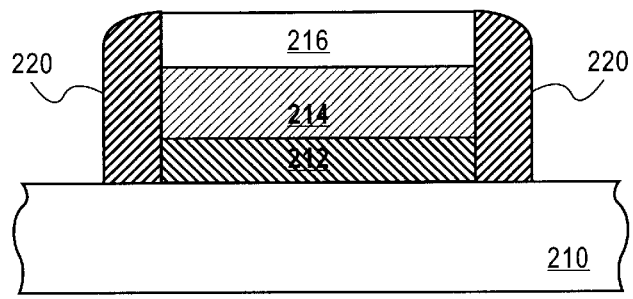

In FIG. 4F, conventional methods are used to form spacers 220 on opposite sides of the high-k dielectric layer 212, the silicon interfacial layer 214, and the gate electrode 216. In one example, the making the spacers 220 begins with depositing the spacer material (e.g., a CVD oxide film) over the high-k dielectric layer 212, the silicon interfacial layer 214, and the gate electrode 216. The spacer material is then planarized with the surface of the gate electrode 216, masked with a photoresistive material to shield the spacers 220, and thereafter, etched. Removal of the spacer material leaves spacer 220. The photoresistive material is then removed. It will be appreciated that the material chosen for the spacer deposition could also be a silicon dioxide, an oxide, a nitride, or an oxy-nitride film, for example.

Alternatively, the deposition process may involves is to deposit the spacer material conformally over gate and etch isotropically the material from all horizontal surfaces top of gates and above source/drain and isolation, leaving vertical spacers on the sides of all gates. No lithography or planarization is involved in spacer formation.

Figure 4G:
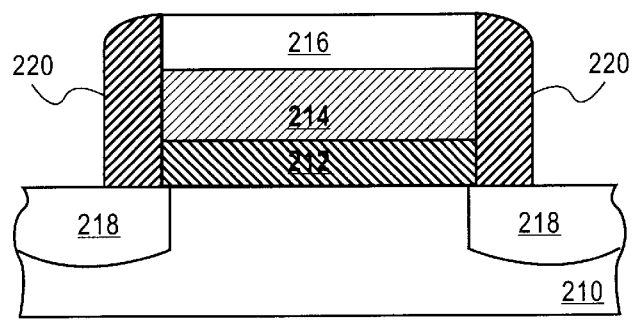

And finally, as shown in FIG. 4G, p-type of n-type dopants are bombarded into the MOS transistor, preferably, by using an ion implantation process. Other process such as thermal diffusion can also be used. In one example, the doping process results in a highly doped gate electrode 216 having a sheet resistance less than 500 Ohms/sq. The ion concentration for the dopants can be in the range of $8\times10^{14}$ to $8\times10^{15}$ ions/cm$^2$. The implant energy can range from approximately 0.5KeV to 5KeV. The doping process also results in the formation of the source and drain regions 218 having either the p-type or the n-type dopant. It is to be noted that doping to form the source and drain regions 218 may have occurred prior to the formation of the spacers 220. In that event, doping the spacers 220 result in the source and drain regions 218 having areas of different dopants' concentrations.

In a preferred embodiment, the last step is annealing the complete electronic device that has all the necessary films deposited thereon. Annealing will activate the dopants in the electronic devices and repair any surface damages to the silicon substrate 210 or the various silicon layers during processing. Annealing the substrate according to the present embodiment can be accomplished via a thermal annealing, rapid thermal processing, or microwave annealing process, methods well practiced in the field.

In a preferred method, the annealing source gas used for annealing thermally contains no hydrogen (e.g., oxygen, nitrogen, argon, and ozone). Annealing the electronic devices after all layers have been deposited also reduces leakage and provides robust interface. In one example, the device may be annealed in nitrogen at a temperature in the order of 700–800° C. for duration of two minutes in a rapid thermal annealing system or for thirty minutes in a furnace.

In another exemplary process (not shown), the gate electrode for a MOS transistor such as the MOS transistor 201 includes only the hydrogen-free silicon layer 215. There is no silicon interfacial layer 214 deposited between the high-k dielectric layer 212 and the gate electrode 215 (see FIG. 2A). The sputtering process described relative to FIG. 4B above can be used to form the gate electrode layer 215. During the sputtering process, the silicon target substrate (e.g., single crystalline silicon and polysilicon substantially free of hydrogen impurities) for the silicon layer 214 is heavily doped with p-type dopants (e.g., boron) for an NMOS device and p-type impurities (e.g., arsenic or phosphorous) for a PMOS device. After the sputtering process, more treatment may be done to the hydrogen-free silicon layer 215 such as bombardment (e.g., via ion implantation) of dopants into the layer 215 to create the appropriate gate electrode for the NMOS or the PMOS transistor. In this event, when the silicon layer 215 is formed, the silicon layer 215 is the gate electrode for the NMOS or the PMOS transistor.

The choice between having a silicon interfacial layer 214 between the gate electrode and the high-k dielectric layer (see FIG. 3) and having no silicon interfacial layer 214 depends on considerations such as applications and times. When time is an issue, the depositing a silicon interfacial layer 214 between the gate electrode and the high-k dielectric layer may be more appropriate since it would only take a few minutes to sputter the hydrogen-free silicon layer 214 onto the high-k dielectric layer and another few minutes to deposit a conventional gate electrode (e.g., polysilicon gate electrode) using CVD. When completely eliminating hydrogen impurities from the transistor is desirable, making the gate electrode consisting of only the hydrogen-free silicon layer 215 is preferred. This method eliminates the polysilicon deposition step typically done via CVD, thus, eliminating the hydrogen impurities typically present in the deposition of the polysilicon layer.

The present invention eliminates the use of metal gate by making a silicon gate electrode compatible with the high-k gate dielectric. This is done by making the silicon gate electrode hydrogen-free or by inserting the interfacial silicon layer that hydrogen-free between the gate electrode and the high-k gate dielectric.

The discussion above focuses on MOS transistors and their methods of fabrication. However, it will be appreciated that the other electronic devices such as memories, transistors, diodes, or capacitors, made using the methods below or made to include the silicon layers described below will fall within the scope of the present invention.

We claim:

1. A method of forming a semiconductor device comprising:
   depositing a high-k gate dielectric layer on a substrate;
   depositing a gate electrode on said gate dielectric layer by evaporating silicon crystals to form said gate electrode, said gate electrode including a hydrogen-free silicon layer;
   treating said gate electrode such that said gate electrode is conductive; and
   converting said silicon crystals into silicon vapors in a low vacuum chamber having a pressure less than or equal to 1 mTorr and a temperature at a boiling point of said silicon crystals; and
   flowing said silicon vapors into a deposition chamber, said deposition chamber houses said substrate; and
   condensing said silicon vapors on said gate dielectric to form said gate electrode, said deposition chamber being remote from said low vacuum chamber.

2. A method as in claim 1 further comprising:
   depositing a polysilicon layer on said hydrogen-free silicon layer such that said hydrogen-free silicon layer is located between said high-k gate dielectric layer and said polysilicon layer, and
   treating said polysilicon layer such that said polysilicon layer is conductive.

3. A method as in claim 2 wherein said polysilicon layer includes hydrogen impurities.

4. A method as in claim 1 further comprising:
   depositing a silicon layer on said hydrogen-free silicon layer such that said hydrogen-free silicon layer is located between said high-k gate dielectric layer and said silicon layer; and
   treating said silicon layer such that said silicon layer is conductive.

5. A method as in claim 4 wherein said silicon layer includes hydrogen impurities.

6. A method as in claim 1 wherein said depositing of said gate electrode on said gate dielectric is such that said gate electrode has a thickness in a range of approximately 25–1000 angstroms and wherein said depositing of said gate dielectric layer on said substrate is such that said gate dielectric layer has a thickness in a range of approximately 10–200 angstroms.

* * * * *

UNITED STATES PATENT AND TRADEMARK OFFICE
CERTIFICATE OF CORRECTION

PATENT NO. : 6,620,713 B2
DATED : September 16, 2003
INVENTOR(S) : Arghavani et al.

It is certified that error appears in the above-identified patent and that said Letters Patent is hereby corrected as shown below:

Column 4,
Line 13, before "the silicon", delete "rat".
Line 25, delete "nitrate", insert -- niobate --.

Column 6,
Line 18, delete "nitrate", insert -- niobate --.

Signed and Sealed this

Twenty-third Day of December, 2003

JAMES E. ROGAN
*Director of the United States Patent and Trademark Office*